US011078570B2

(12) United States Patent
Agarwal et al.

(10) Patent No.: US 11,078,570 B2
(45) Date of Patent: Aug. 3, 2021

(54) AZIMUTHAL CRITICAL DIMENSION NON-UNIFORMITY FOR DOUBLE PATTERNING PROCESS

(71) Applicant: LAM RESEARCH CORPORATION, Fremont, CA (US)

(72) Inventors: Pulkit Agarwal, Beaverton, OR (US); Adrien Lavoie, Newberg, OR (US); Frank Loren Pasquale, Beaverton, OR (US); Ravi Kumar, Providence, RI (US)

(73) Assignee: Lam Research Corporation, Fremont, CA (US)

( * ) Notice: Subject to any disclaimer, the term of this patent is extended or adjusted under 35 U.S.C. 154(b) by 130 days.

(21) Appl. No.: 16/023,069

(22) Filed: Jun. 29, 2018

(65) Prior Publication Data

US 2020/0002815 A1      Jan. 2, 2020

(51) Int. Cl.
*C23C 16/455*      (2006.01)
*C23C 16/52*       (2006.01)

(52) U.S. Cl.
CPC .. *C23C 16/45565* (2013.01); *C23C 16/45536* (2013.01); *C23C 16/52* (2013.01)

(58) Field of Classification Search
CPC ........ C23C 16/45565; C23C 16/45536; C23C 16/52
USPC ........................................... 427/248.1–255.7
See application file for complete search history.

(56) References Cited

U.S. PATENT DOCUMENTS

| | | | | |
|---|---|---|---|---|
| 2004/0085246 A1* | 5/2004 | Howald | ................ | H01J 37/321 343/701 |
| 2007/0235660 A1* | 10/2007 | Hudson | ............. | H01J 37/32321 250/423 P |
| 2008/0246493 A1 | 10/2008 | Gardner | | |
| 2009/0120584 A1 | 5/2009 | Lubomirsky et al. | | |
| 2009/0276097 A1 | 11/2009 | Patalay et al. | | |
| 2013/0005140 A1* | 1/2013 | Jeng | ...................... | C23C 16/045 438/653 |
| 2013/0072025 A1* | 3/2013 | Singh | ................ | H01L 21/67069 438/732 |
| 2013/0230987 A1* | 9/2013 | Draeger | .............. | H01L 21/0217 438/694 |
| 2017/0191160 A1* | 7/2017 | Wiltse | ............... | C23C 16/45565 |

(Continued)

OTHER PUBLICATIONS

Notification of Transmittal of the International Search Report and the Written Opinion of the International Searching Authority corresponding to International Application No. PCT/US2019/038970 dated Oct. 10, 2019, 11 pages.

*Primary Examiner* — Michael P Wieczorek
*Assistant Examiner* — Michael G Miller (57) ABSTRACT

A method for adjusting a position of a showerhead in a processing chamber includes arranging a substrate that includes a plurality of mandrels on a substrate support in the processing chamber and adjusting a position of the showerhead relative to the substrate support. Adjusting the position of the showerhead includes adjusting the showerhead to a tilted position based on data indicating a correlation between the position of the showerhead and azimuthal non-uniformities associated with etching the substrate. The method further includes, with the showerhead in the tilted position as adjusted based on the data, performing a trim step to etch the plurality of mandrels.

8 Claims, 9 Drawing Sheets

(56) References Cited

U.S. PATENT DOCUMENTS

2017/0200641 A1* 7/2017 Tsai .................. H01L 21/76802
2017/0309528 A1* 10/2017 Bansal ................ C23C 16/4583

* cited by examiner

AZIMUTHAL CRITICAL DIMENSION NON-UNIFORMITY FOR DOUBLE PATTERNING PROCESS

FIELD

The present disclosure relates to double patterning processes in an atomic layer deposition substrate processing chamber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Examples of substrate treatments include etching, deposition, photoresist removal, etc. During processing, the substrate is arranged on a substrate support such as an electrostatic chuck and one or more process gases may be introduced into the processing chamber.

The one or more process gases may be delivered by a gas delivery system to the processing chamber. In some systems, the gas delivery system includes a manifold connected by one or more conduits to a showerhead that is located in the processing chamber. In some examples, the process deposits a thin film on a substrate using atomic layer deposition (ALD).

SUMMARY

A method for adjusting a position of a showerhead in a processing chamber includes arranging a substrate that includes a plurality of mandrels on a substrate support in the processing chamber and adjusting a position of the showerhead relative to the substrate support. Adjusting the position of the showerhead includes adjusting the showerhead to a tilted position based on data indicating a correlation between the position of the showerhead and azimuthal non-uniformities associated with etching the substrate. The method further includes, with the showerhead in the tilted position as adjusted based on the data, performing a trim step to etch the plurality of mandrels.

In other features, the data indicates a sensitivity of the azimuthal non-uniformities to a plurality of tilted positions of the showerhead. The method further includes collecting the data and storing the data in memory. Collecting the data includes adjusting the showerhead to a plurality of different tilted positions, performing a plurality of trim steps when the showerhead is in the plurality of different tilted positions, and determining azimuthal non-uniformities associated with performing the plurality of trim steps in each of the plurality of different tilted positions.

In other features, adjusting the position of the showerhead includes adjusting the position of the showerhead to a tilted position having a smallest standard deviation of etch amounts across a surface of the substrate as indicated by the data. The method further includes, subsequent to performing the trim step, depositing a spacer layer on the mandrels. The trim step is performed in a self-aligned double patterning process. The method further includes determining the tilted position of the showerhead based on the data and providing information indicating the tilted position. The method further includes providing the information to a user interface. The method further includes controlling an actuator to adjust the position of the showerhead to the tilted position based on the information.

A controller configured to adjust a position of a showerhead in a processing chamber includes memory that stores data indicating a correlation between the position of the showerhead and azimuthal non-uniformities associated with etching a substrate arranged on a substrate support in the processing chamber. A position calculation module is configured to determine a tilted position of the showerhead relative to the substrate support based on the data stored in the memory. The controller is further configured to, with the substrate arranged on the substrate support and the showerhead in the tilted position as adjusted based on the data, perform a trim step to etch a plurality of mandrels formed on the substrate.

In other features, the data indicates a sensitivity of the azimuthal non-uniformities to a plurality of tilted positions of the showerhead. The controller is further configured to collect the data and store the data in the memory. To collect the data, the controller is configured perform a plurality of trim steps when the showerhead is in a plurality of different tilted positions and determine azimuthal non-uniformities associated with performing the plurality of trim steps in each of the plurality of different tilted positions.

In other features, the tilted position corresponds to a tilted position having a smallest standard deviation of etch amounts across a surface of the substrate as indicated by the data. The controller is further configured to, subsequent to performing the trim step, deposit a spacer layer on the mandrels. The trim step is performed in a self-aligned double patterning process. The position calculation module is configured to output information indicating the tilted position. The position calculation module is configured to provide the information to a user interface. The controller further includes a showerhead adjustment module configured to control an actuator to adjust the position of the showerhead to the tilted position based on the information.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In film deposition processes such as atomic layer deposition (ALD), various properties of the deposited film vary across a spatial (i.e., x-y coordinates of a horizontal plane) distribution. For example, substrate processing tools may have respective specifications for film thickness non-uniformity (NU), which may be measured as a full-range, a half-range, and/or a standard deviation of a measurement set taken at predetermined locations on a surface of a semiconductor substrate. In some examples, the NU may be reduced either by, for example, addressing a direct cause of the NU and/or introducing a counteracting NU to compensate and cancel the existing NU. In other examples, material may be intentionally deposited and/or removed non-uniformly to compensate for known non-uniformities at other (e.g. previous or subsequent) steps in a process.

Double patterning (DPT) ALD processes (e.g., a self-aligned double patterning, or SADP, process) may include steps including, but not limited to, a lithography step, a trim step, and a sacrificial spacer layer deposition step. Each step may have associated NUs affecting overall critical dimension (CD) NU and imbalance. For example, the trim step may be performed between the lithography step and the spacer layer deposition step to reduce the CD. However, trim NU may result in non-uniform double patterning, which increases CD imbalance and results in poor yield. Trim NU may be characterized as radial NU and azimuthal NU. Various methods may be used to tune radial NU. However, tuning azimuthal NU may be difficult.

Systems and methods according to the principles of the present disclosure are configured to tune (e.g., reduce) azimuthal NU in a double patterning ALD process. For example, a gas distribution device (e.g., a showerhead) in an ALD processing chamber is configured to tilt (e.g., during a trim step) to reduce azimuthal NU.

Figure 1:
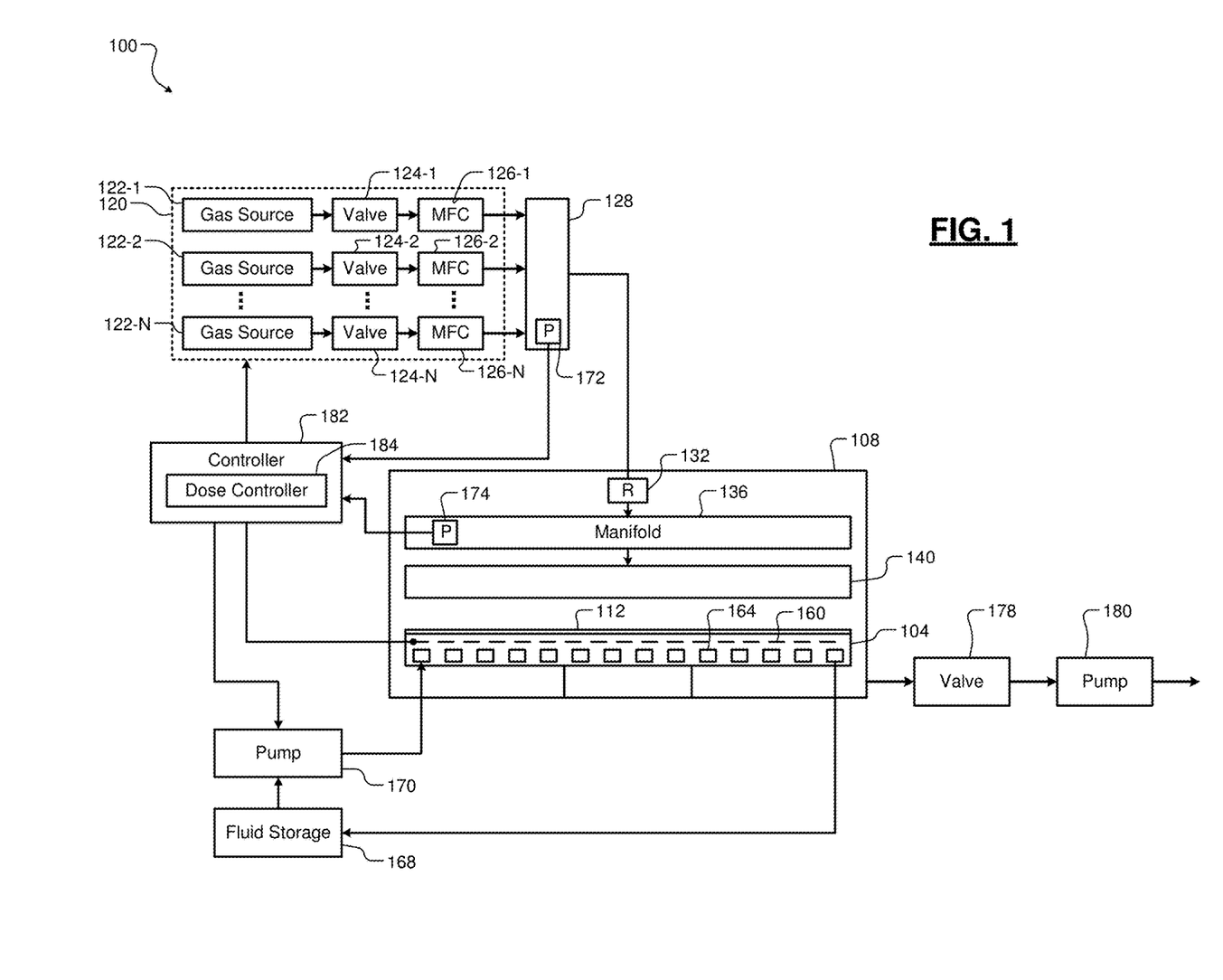
FIG. 1 is a functional block diagram of an example of a substrate processing system including a tiltable showerhead according to the present disclosure.

Referring now to FIG. 1, an example of a substrate processing system 100 including a substrate support (e.g., an ALD pedestal) 104 according to the present disclosure is shown. The substrate support 104 is arranged within a processing chamber 108. A substrate 112 is arranged on the substrate support 104 during processing.

A gas delivery system 120 includes gas sources 122-1, 122-2, ..., and 122-N (collectively gas sources 122) that are connected to valves 124-1, 124-2, ..., and 124-N (collectively valves 124) and mass flow controllers 126-1, 126-2, ..., and 126-N (collectively MFCs 126). The MFCs 126 control flow of gases from the gas sources 122 to a manifold 128 where the gases mix. An output of the manifold 128 is supplied via an optional pressure regulator 132 to a manifold 136. An output of the manifold 136 is input to a gas distribution device such as a multi-injector showerhead 140. While the manifold 128 and 136 are shown, a single manifold can be used. The showerhead 140 according to the principles of the present disclosure is configured to be tilted during processing of the substrate 112 as described below in more detail.

In some examples, a temperature of the substrate support 104 may be controlled using resistive heaters 160. The substrate support 104 may include coolant channels 164. Cooling fluid is supplied to the coolant channels 164 from a fluid storage 168 and a pump 170. Pressure sensors 172, 174 may be arranged in the manifold 128 or the manifold 136, respectively, to measure pressure. A valve 178 and a pump 180 may be used to evacuate reactants from the processing chamber 108 and/or to control pressure within the processing chamber 108.

A controller 182 includes a dose controller 184 that controls dosing provided by the multi-injector showerhead 140. The controller 182 also controls gas delivery from the gas delivery system 120. The controller 182 controls pressure in the processing chamber and/or evacuation of reactants using the valve 178 and the pump 180. The controller 182 controls the temperature of the substrate support 104 and the substrate 112 based upon temperature feedback (e.g., from sensors (not shown) in the substrate support and/or sensors (not shown) measuring coolant temperature).

Figure 2A:
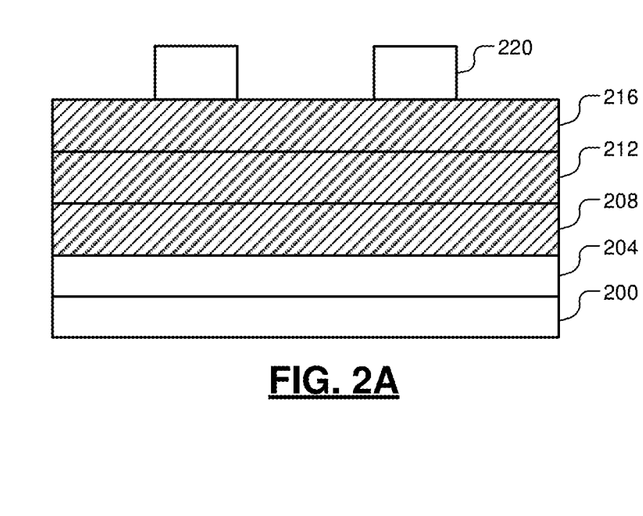
FIGS. 2A through 2K illustrate an example of a double patterning atomic layer deposition process according to the present disclosure.

Referring now to FIGS. 2A-2K, an example SADP process is described. FIG. 2A shows a substrate 200 including, for example, a hardmask layer 204 formed thereon. For example only, the substrate 200 includes a silicon (Si) substrate and the hardmask layer 204 is made of a silicon nitride ($Si_3N_4$), although other materials may be used. A plurality of core layers (e.g., mandrel layers) 208, 212, and 216 are deposited on the hardmask layer 204 (e.g., using chemical vapor deposition, or CVD). For example only, the core layers 208, 212, and 216 may include amorphous silicon (a-Si). In some examples, the core layers 208, 212, and 216 may have a height of approximately 50-150 nm (e.g., 100 nm). A patterning layer (e.g., a patterned photoresist layer or mask) 220 is formed on the core layer 216 and patterned using photolithography.

Figure 2B:
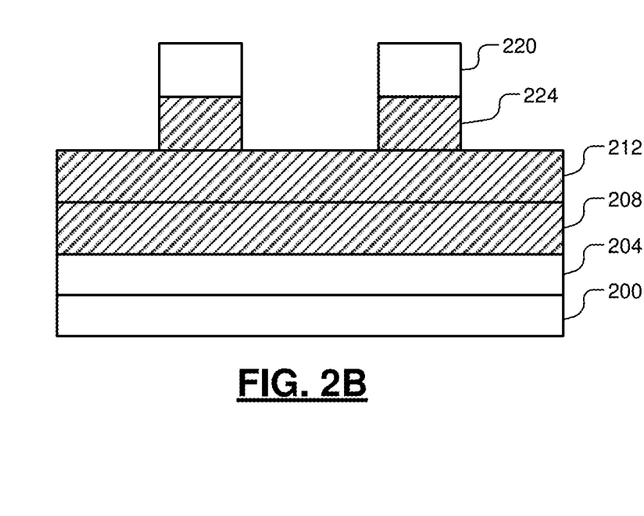

The substrate 200 including the hardmask layer 204, the core layers 208, 212, and 216, and the mask 220 is arranged within a processing chamber (e.g., an inductively coupled plasma chamber of an etch tool). As shown in FIG. 2B, the core layer 216 is etched (e.g., using an anisotropic etch or other process) to form a plurality of mandrels 224. The mask 220 protects the portions of the core layer 216 corresponding to the mandrels 224 during the etching of the core layer 216. If the mask 220 is a photoresist mask, the mask 220 can be removed with an oxygen containing plasma. If the mask 220 is of a material similar to a spacer layer 228 as described below, the mask 220 may remain on the mandrels 224 and may be etched during the etching of the spacer layer 228.

Figure 2C:
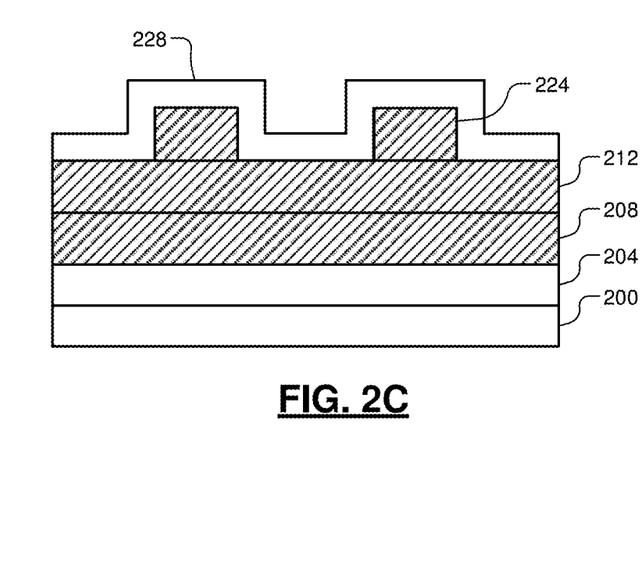

In FIG. 2C, the spacer layer 228 is deposited over the substrate 200 (i.e., on the core layer 212 and the mandrels 224). For example only, the spacer layer 228 may be conformally deposited using ALD, such as an oxide-type deposition (using precursors including silicon tetrachloride ($SiCl_4$), silane ($SiH_4$), etc.), a nitride-type deposition (using precursors including molecular nitrogen, ammonia ($NH_3$), etc.), and/or a carbon based deposition (using precursors including methane ($CH_4$), fluoromethane ($CH_3F$), etc.).

In one example, the spacer layer 228 is deposited using a $SiCl_4$ precursor in the presence of $O_2$. Other example process parameters for performing the deposition of the spacer layer 228 include temperature variation between a minimum temperature less than 10° C. up to 120° C., plasma power between 200 and 1800 W, a bias voltage from 0 to approximately 1000 volts, and a chamber pressure between 2 mTorr to 2000 mTorr.

In some examples, a trim step may be performed on the mandrels 224 prior to depositing the spacer layer 228. For example, in the trim step, the mandrels 224 may be etched to adjust widths of the mandrels 224 and dimensions of the spacer layer 228.

Figure 2D:
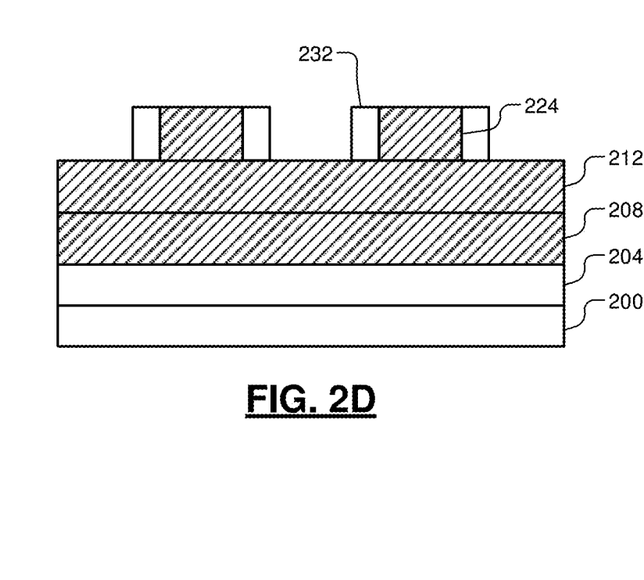
Figure 2E:
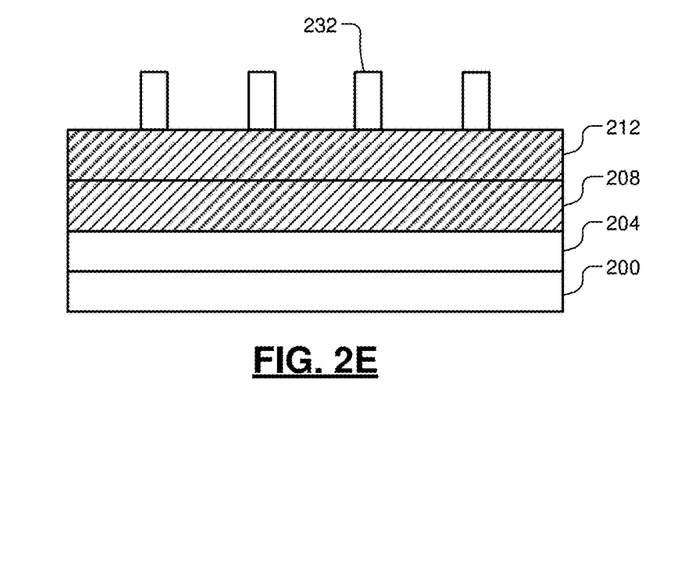

In FIG. 2D, the spacer layer 228 is etched (e.g., using an anisotropic etch process) to remove portions of the spacer layer 228 from the upper surfaces of the core layer 212 and the mandrels 224 while allowing sidewall portions 232 of the spacer layer 228 to remain. In some examples, a breakthrough step may be performed (e.g., a fluoride containing plasma treatment) subsequent to the etch described in FIG. 2D. Further, depending on the material of the spacer layer 228, an oxygen-containing plasma treatment may be performed prior to the fluoride containing plasma treatment. In FIG. 2E, the mandrels 224 are removed (e.g., using an anisotropic etch). Accordingly, the sidewall portions 232 remain formed on the substrate 200.

Figure 2F:
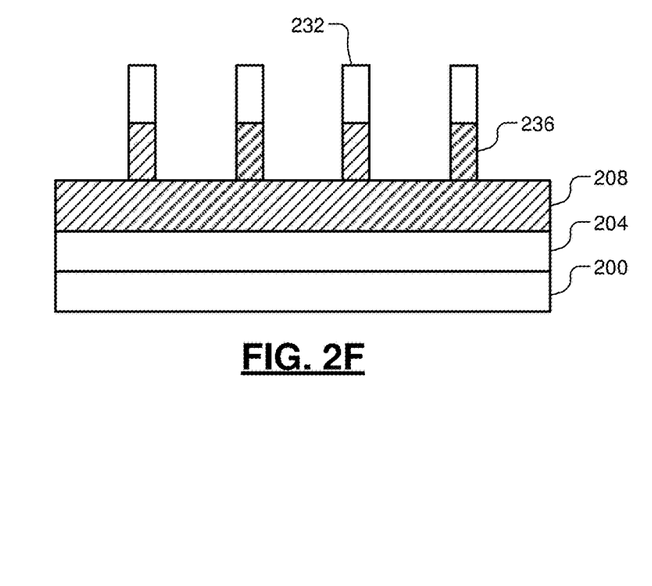

As shown in FIG. 2F, the core layer 212 is etched (e.g., using an anisotropic etch or other process) to form a plurality of mandrels 236. The sidewall portions 232 act as a mask to protect the portions of the core layer 212 corresponding to the mandrels 236 during the etching of the core layer 212. The sidewall portions 232 can be removed in an additional plasma etching step, during the etching of a spacer layer 240 as described below, etc.

Figure 2G:
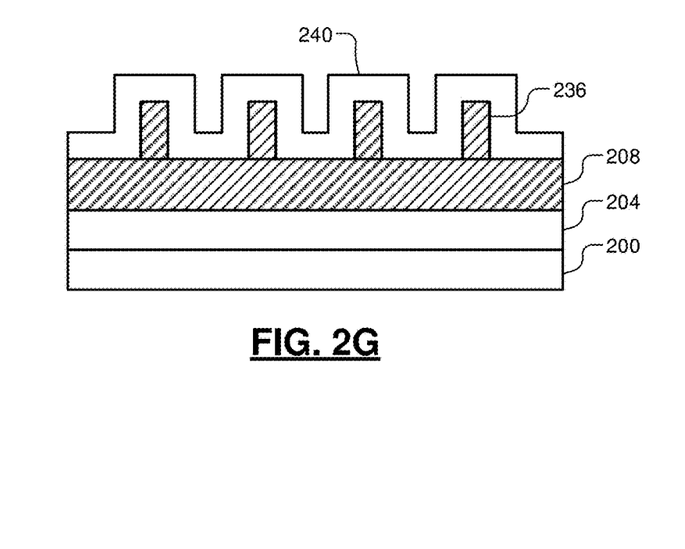

In FIG. 2G, the spacer layer 240 is deposited over the substrate 200 (i.e., on the core layer 208 and the mandrels 236). For example only, the spacer layer 240 may be conformally deposited using ALD in a manner similar to the spacer layer 228. In some examples, a trim step may be performed on the mandrels 236 prior to depositing the spacer layer 240.

Figure 2H:
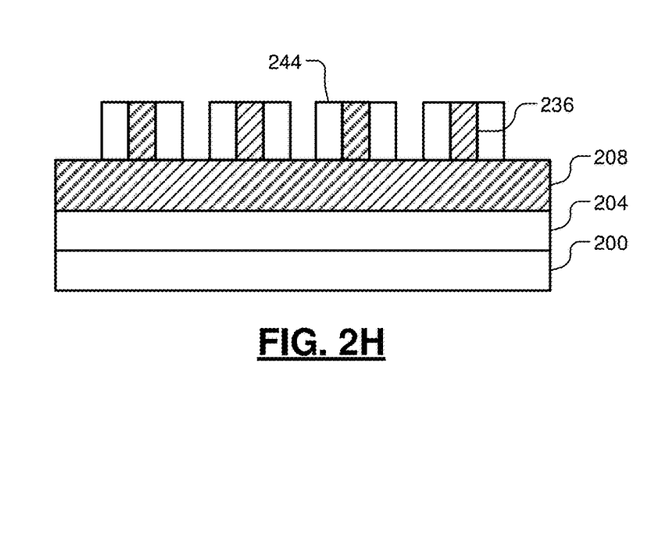
Figure 2I:
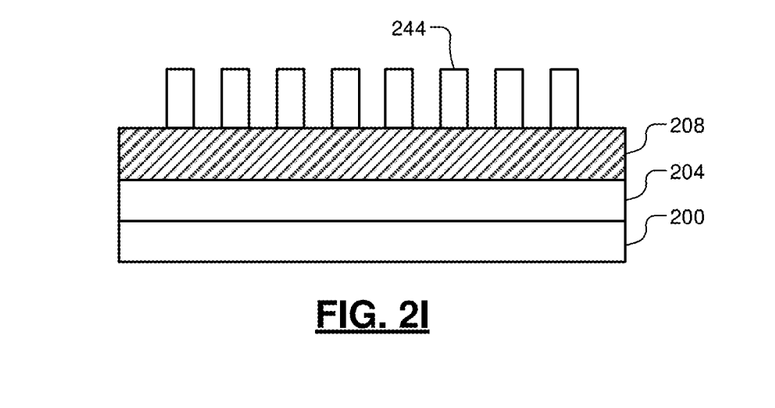

In FIG. 2H, the spacer layer 240 is etched (e.g., using an anisotropic etch process) to remove portions of the spacer layer 240 from the upper surfaces of the core layer 208 and the mandrels 236 while allowing sidewall portions 244 of the spacer layer 240 to remain. In some examples, a breakthrough step may be performed (e.g., a fluoride containing plasma treatment) subsequent to the etching described in FIG. 2H. Further, depending on the material of the spacer layer 240, an oxygen-containing plasma treatment may be performed prior to the fluoride containing plasma treatment. In FIG. 2I, the mandrels 236 are removed (e.g., using an anisotropic etch). Accordingly, the sidewall portions 244 remain formed on the substrate 200.

Figure 2J:
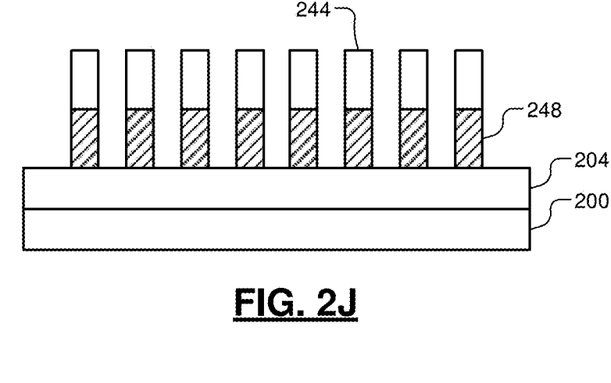

As shown in FIG. 2J, the core layer 208 is etched (e.g., using an anisotropic etch or other process) to form a plurality of mandrels 248. The sidewall portions 244 act as a mask to protect the portions of the core layer 208 corresponding to the mandrels 248 during the etching of the core layer 208. The sidewall portions 244 can be removed in, for example, an additional plasma etching step as shown in FIG. 2K.

Figure 2K:
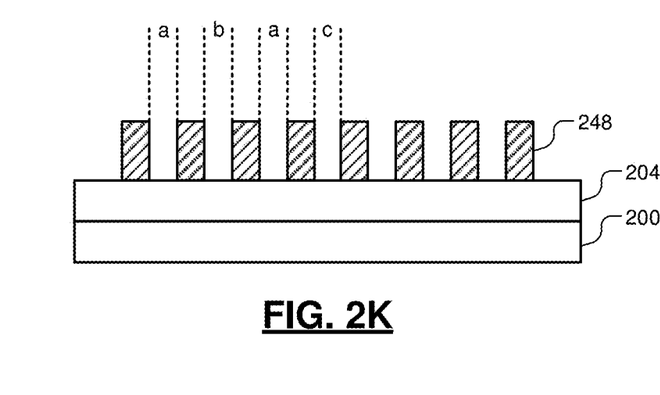

As shown in FIG. 2K, the SADP process results in the mandrels 248 formed on the substrate 200 (e.g., on the hardmask layer 204) in a spaced pattern. A spacing between the mandrels 248 is determined in accordance with a spacing between the sidewall portions 244 as shown in FIG. 2I, which is in turn determined in accordance with a spacing between the sidewall portions 232 as shown in FIG. 2E. Widths of the mandrels 236 and the mandrels 232 determine the respective spacing between the sidewall portions 44 and the sidewall portions 232 and, therefore, the spacing between the mandrels 248. Accordingly, the trim steps may be performed on the mandrels 232 and the mandrels 236 to ensure uniform spacing between the mandrels 248. For example, respective widths of the mandrels 232 and the mandrels 236 may be trimmed to achieve a uniform spacing such that a=b=c as shown in FIG. 2K.

Figure 3A:
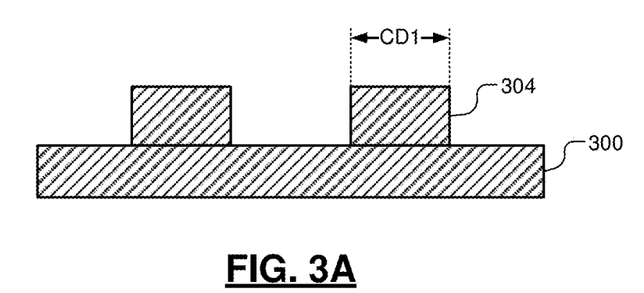
FIGS. 3A through 3D illustrate an example trim step of a self-aligned double patterning process according to the present disclosure.
Figure 3B:
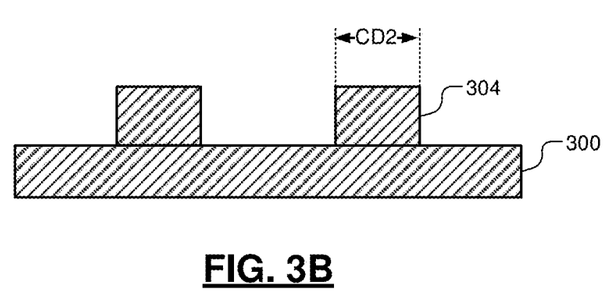
Figure 3C:
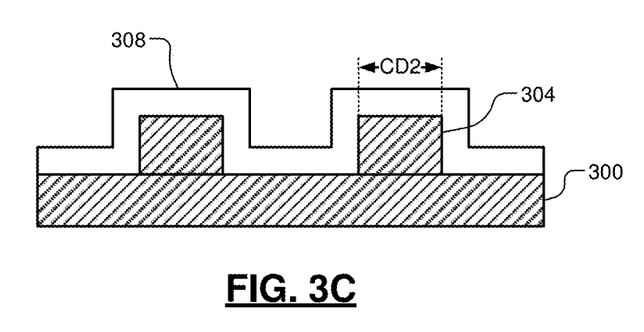

Referring now to FIGS. 3A, 3B, 3C, and 3D, an example trim step of an SADP process is described. For simplicity, only a single core layer 300 and mandrels 304 are shown. In FIG. 3A, the mandrels 304 are shown prior to a trim step (e.g., subsequent to an etching step to form the mandrels 304 on the core layer 300, such as shown in FIG. 2B). A width of the mandrels 304 corresponds to a critical dimension CD1. The mandrels 304 are trimmed (e.g., etched) as shown in FIG. 3B to adjust the width of the mandrels 304. Accordingly, the critical dimension of the mandrels 304 is reduced to CD2. In FIG. 3C, a spacer layer 308 is deposited (e.g., conformally deposited using ALD as described above) over the core layer 300 and the mandrels 304.

Figure 3D:
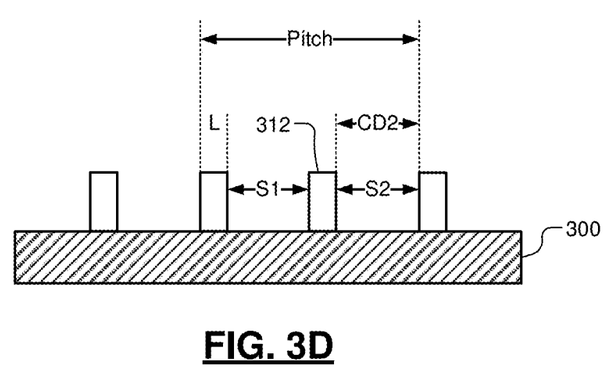

FIG. 3D shows sidewall portions 312 of the spacer layer 308 remaining on the core layer 300 subsequent to performing one or more etch steps to remove portions of the spacer layer 308 and the mandrels 304. Spaces (e.g., S1, S2, etc.) between the sidewall portions 312 correspond to respective widths (e.g., CD2) of the mandrels 304. Accordingly, a pitch of the sidewall portions 312 may be defined as S1+S2+2L, where L corresponds to a line width (i.e., a width of one of the sidewall portions 312.

Figure 4:
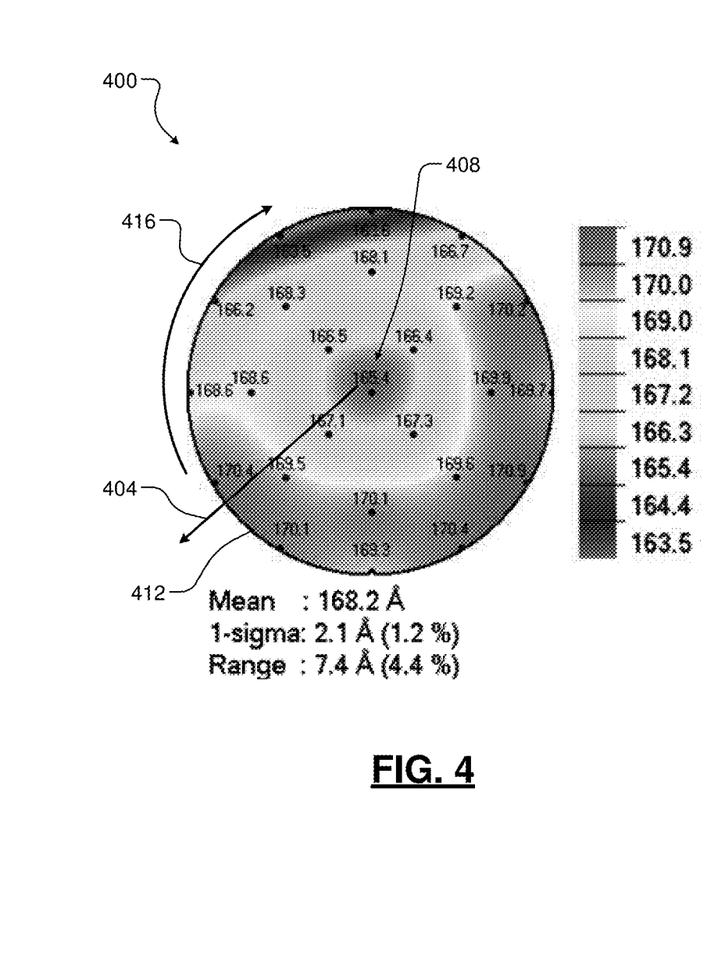
FIG. 4 shows example of radial and azimuthal non-uniformities in etch amounts on a surface of a substrate according to the present disclosure.

Various non-uniformities affect an amount of material deposited (e.g., during ALD steps) and removed (e.g., during etching steps) during processing. For example, etching non-uniformities associated with the trim step include radial non-uniformities and azimuthal non-uniformities. Radial non-uniformities correspond to differences in etch amounts as a radial distance from a center of a substrate increases. Conversely, azimuthal non-uniformities correspond to differences in etch amounts in an angular direction around the substrate. FIG. 4 shows example radial and azimuthal non-uniformities in etch amounts on a surface of a substrate 400. For example, the etch amounts (i.e., an amount etched from the surface of the substrate 400) may range from 163.5 Angstroms to 170.9 Angstroms, or a range of 7.4 Angstroms. As shown by radial line 404 in an example radial direction, the etch amount ranges from 165.4 Angstroms in a center region 408 of the substrate 400 to 170.4 Angstroms at an edge 412 of the substrate 400. Conversely, as shown by arc 416 in an example azimuthal direction, the etch amount ranges from 170.4 Angstroms to 163.5 Angstroms along the edge 412.

Various methods may be used to tune the radial non-uniformities, including, but not limited to, injecting edge tuning gases, adjusting edge ring height, controlling temperatures across the substrate 400, adjusting pressures, etc. These methods may not sufficiently reduce the azimuthal non-uniformities.

Figure 5:
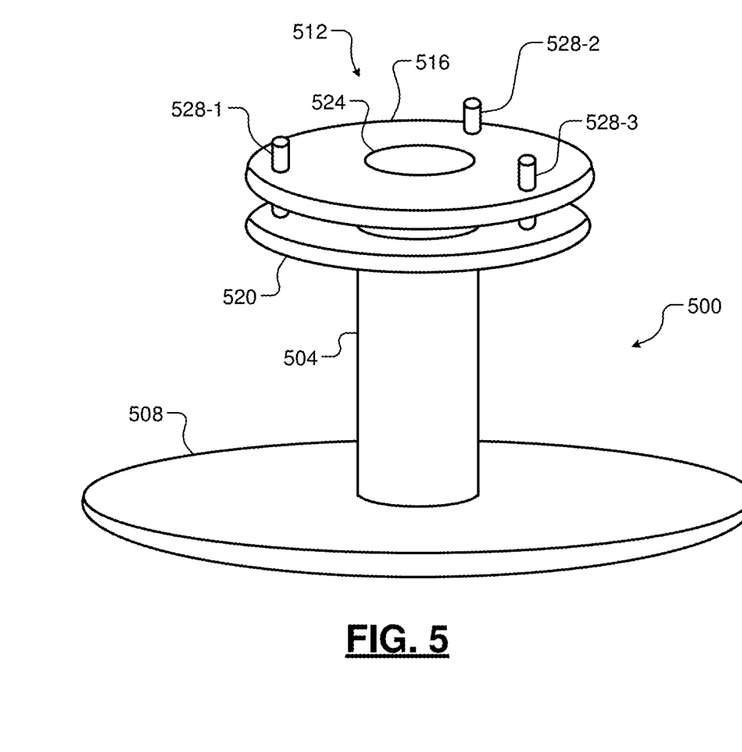
FIG. 5 shows an example gas distribution device that is tiltable according to the present disclosure.

Referring now to FIG. 5, an example gas distribution device (e.g., a showerhead) 500 according to the present disclosure is tiltable to adjust azimuthal non-uniformities associated with the trim step. For example, the showerhead 500 may correspond to a three degrees-of-freedom (DOF) adjustable showerhead. The showerhead 500 includes a stem portion 504 and a plasma-facing gas distribution plate (e.g., a faceplate) 508. The stem portion 504 is connected to an upper surface of the processing chamber 108 via a tilt collar 512. For example, the tilt collar 512 includes an upper plate 516 and a lower plate 520. The upper plate 516 is fixedly attached to the upper surface of the processing chamber 108. In some examples, the upper surface of the processing chamber 108 may function as the upper plate 516. Process gases are provided to the gas distribution plate 508 via the stem portion 504 through an inlet 524.

As shown, the stem portion 504 is connected to the lower plate 520, and the lower plate 520 is tiltable relative to the upper plate 516. For example, the showerhead 500 includes tilt adjustment mechanisms 528-1, 528-2, and 528-3, referred to collectively as tilt adjustment mechanisms 528. For example, the tilt adjustment mechanisms 528 may correspond to screws. Turning the screws (e.g., either manually or automatically in response to signals from a controller, such as the controller 182) causes the showerhead 500 to tilt. For example, turning the screws causes a distance between respective portions of the upper plate 516 and the lower plate 520 to increase and decrease, thereby causing the stem portion 504 and the gas distribution plate 508 to tilt accordingly.

Figure 6A:
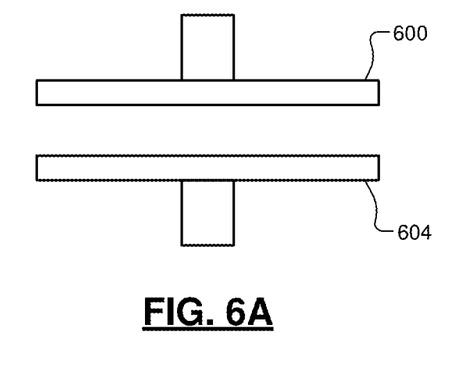
FIGS. 6A through 6D show a gas distribution device in non-tilted and tilted positions according to the present disclosure.
Figure 6B:
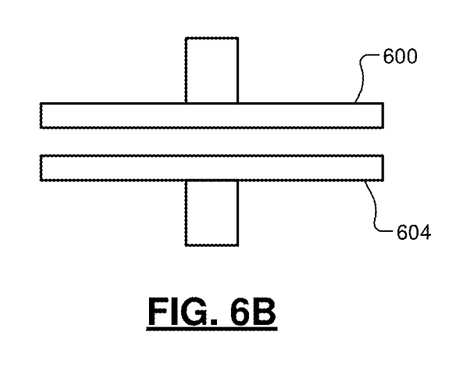
Figure 6C:
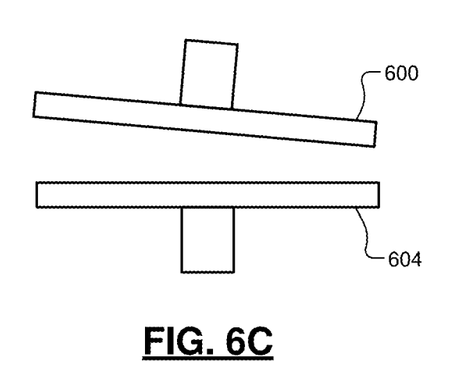
Figure 6D:
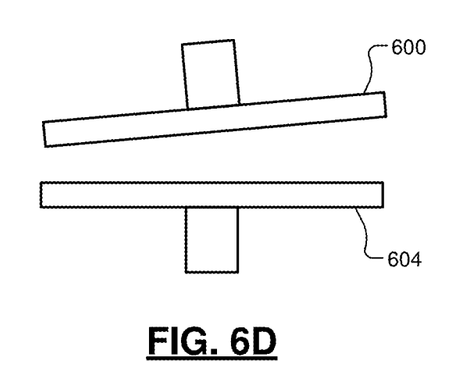

Referring now to FIGS. 6A-6D, a showerhead 600 according to the present disclosure is shown in various positions relative to a substrate support 604. As shown in FIG. 6A, the showerhead 600 is shown in a non-tilted position. For example, in this position, each of the screws as described in FIG. 5 may be adjusted such that the showerhead 600 is a maximum distance from the substrate support 604. Conversely, as shown in FIG. 6B, the screws are adjusted such that the showerhead 600 is a minimum distance from the substrate support 604. FIGS. 6C and 6D show the showerhead 600 in example tilted positions.

Figure 7:
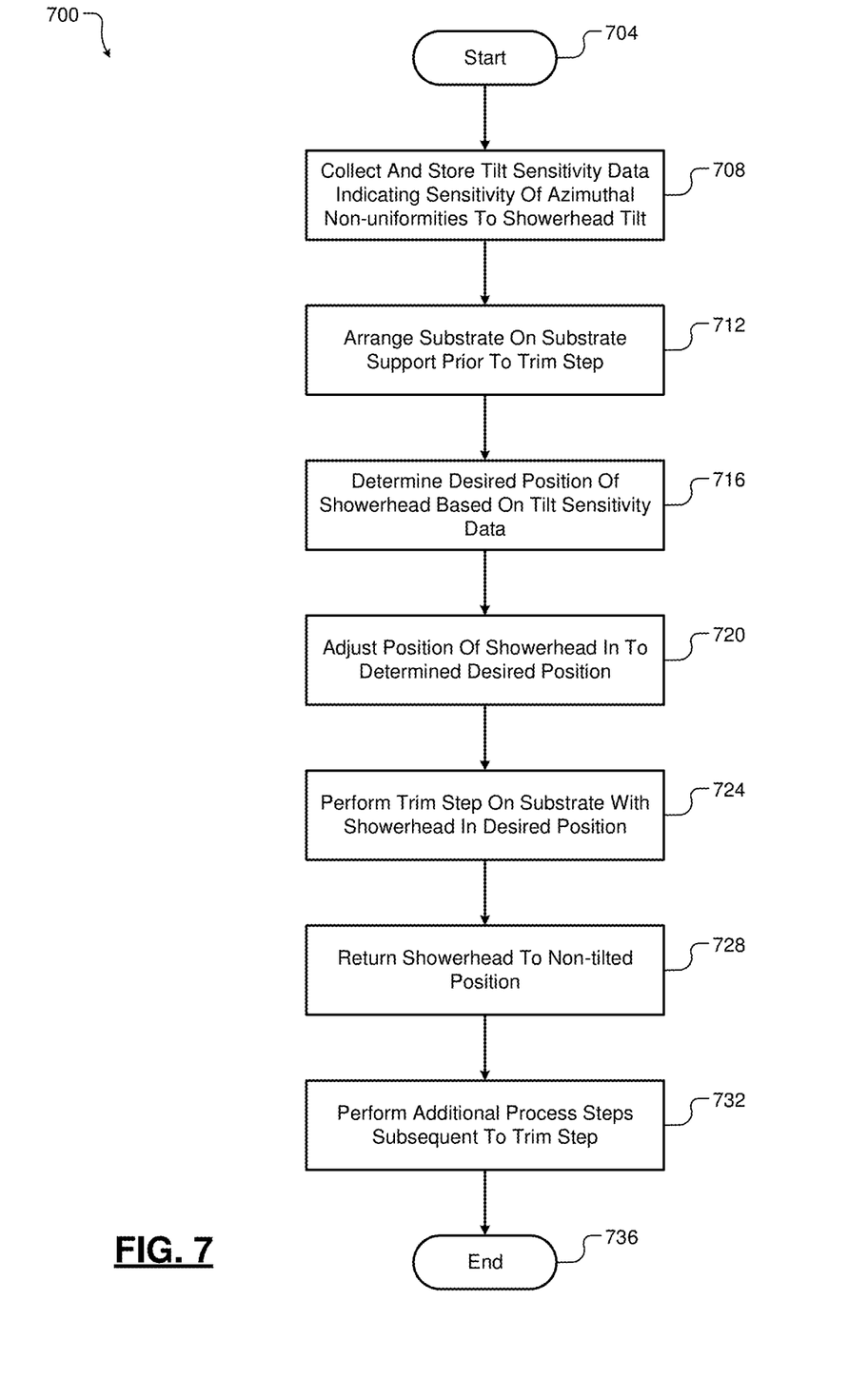
FIG. 7 shows an example method for adjusting a position of a showerhead to tune azimuthal non-uniformities in a trim step according to the present disclosure.

Referring now to FIG. 7, an example method 700 for adjusting a position of a showerhead to tune azimuthal non-uniformities in a trim step begins at 704. At 708, the method 700 collect and stores tilt sensitivity data. For example, the tilt sensitivity data indicates a sensitivity of the azimuthal non-uniformities to showerhead tilt. In one example, the method 700 determines a correlation between various non-tilted and tilted positions and changes in the azimuthal non-uniformities. For example, the showerhead may be adjusted to a plurality of different positions (e.g., a non-tilted position, a first tilted position, a second tilted position, a third tilted position, etc.) while a trim step is performed on a respective substrate. Each of the tilted positions may correspond to a respective tilt direction and an amount (e.g., a degree) of tilt. Subsequent to the trim step, the substrate may then be examined (e.g., using metrology or other inspection methods) to measure the azimuthal non-uniformities for the respective showerhead position.

Accordingly, a desired tilt position may be determined for a trim step based on the determined non-uniformity sensitivities. For example, the tilt sensitivity data indicating the azimuthal non-uniformities for a plurality of tilt positions may be collected and stored in memory, such as memory of a controller (such as the controller 182).

At 712, a substrate is arranged on a substrate support of a processing chamber prior to a trim step. For example, the substrate may be arranged on the substrate support subsequent to a previous processing step, such as the etching of the patterning layer 220 as shown in FIG. 2A. In some examples, the previous processing step may be performed in a same processing chamber as the trim step.

At 716, the method 700 (e.g., the controller 182) determines a desired position of the showerhead based on the stored tilt sensitivity data. For example, the desired (e.g., tilted) position is selected to minimize azimuthal non-uniformities in accordance with the tilt sensitivity data. At 720, the position of the showerhead is adjusted from a non-tilted position to the desired position. In one example, the desired position of the showerhead may be provided to a user (e.g., via a display or other user interface). The desired position may indicate a tilt direction and a tilt amount (e.g., degree, displacement distance, etc.), respective positions of adjustment screws (e.g., the tilt adjustment mechanisms 528), etc. The user may then manually adjust the position of the showerhead.

In other examples, the method 700 may automatically adjust the position of the showerhead according to the desired position determined in accordance with the tilt sensitivity data. For example, in some systems, the tilt adjustment mechanisms 528 may be connected to actuators (e.g., rotational actuators, pin actuators, etc. as shown below in more detail) configured to adjust the position of the showerhead in response to signals received from the controller 182.

At 724, the method 700 performs the trim step. At 728, the showerhead is returned to the non-tilted position. At 732, the method 700 performs additional process steps subsequent to the trim step (e.g., as shown in FIGS. 2C through 2K). The additional process steps may be performed in the same or a different processing chamber as the trim step. The method 700 ends at 736.

Figure 8:
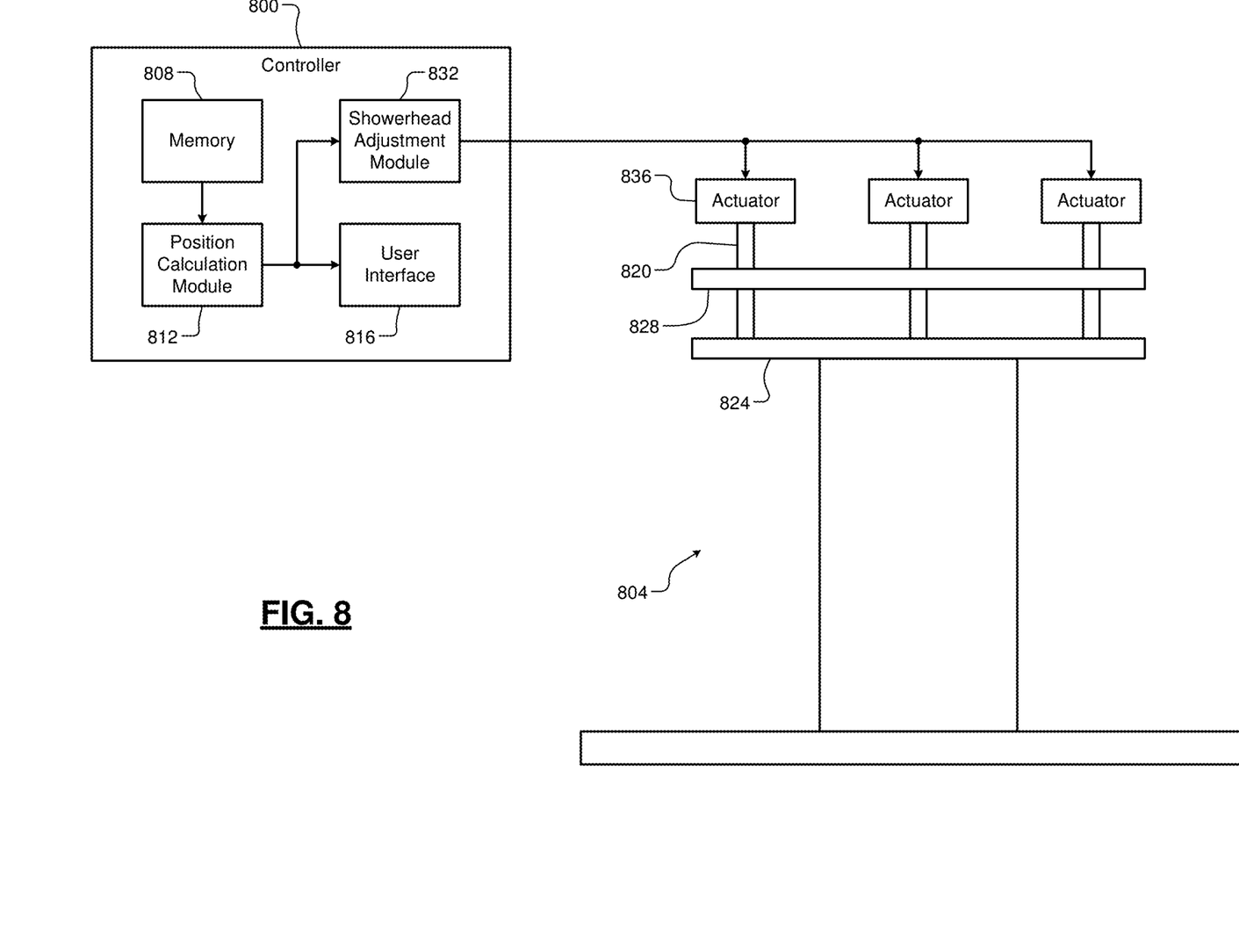
FIG. 8 shows an example controller configured to determine a desired position of a showerhead to tune azimuthal non-uniformities according to the present disclosure.

Referring now to FIG. 8, an example controller 800 is configured to determine a desired position of a showerhead 804 to tune azimuthal non-uniformities according to the present disclosure. For example, the controller 800 includes memory 808 that stores tilt sensitivity data as described above in FIG. 7. Prior to a trim step, a position calculation module 812 retrieves the tilt sensitivity data from the memory 808 and determines a desired position of the showerhead 804 based on the stored tilt sensitivity data. In one example, the position calculation module 812 is configured to execute a model or algorithm, use a lookup table, etc. based on the stored tilt sensitivity data to determine a desired position of the showerhead 804. For example, the tilt sensitivity data may correlate each position (e.g., tilt direction and amount) of the showerhead 804 to a plurality of etch amounts across a surface of a substrate, and the position calculation module 812 may select a position to minimize variance between the etch amounts. In one example, the position calculation module 812 selects a position having a smallest standard deviation of the etch amounts.

The position of the showerhead 804 is adjusted based on the position determined by the position calculation module 812. For example, the position calculation module 812 may provide information indicating the desired position to a user interface 816 (e.g., a display). A user may manually adjust the position of the showerhead 804 based on the information provided to the user interface 816. In one example, the showerhead 804 includes one or more tilt adjustment mechanisms 820 that may be manually adjusted to adjust a position of a lower plate 824 relative to an upper plate 828. For example, the tilt adjustment mechanisms 820 may correspond to screws as described above in FIG. 5. In other examples, the position calculation module 812 provides the information to a showerhead adjustment module 832. The showerhead adjustment module 832 is configured to adjust the position of the showerhead 804. For example, the showerhead adjustment module 832 controls one or more actuators 836 to adjust respective tilt adjustment mechanisms 820. The actuators 836 may correspond to rotational actuators configured to rotate the tilt adjustment mechanisms 820 (i.e., when the tilt adjustment mechanisms 820 correspond to screws), linear actuators configured to move the tilt adjustment mechanisms 820 upward and downward (i.e., when the tilt adjustment mechanisms 820 correspond to pins), etc.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for adjusting a position of a showerhead in a processing chamber, the method comprising:
   arranging a substrate on a substrate support in the processing chamber, wherein a plurality of mandrels are formed on the substrate;
   adjusting a position of the showerhead relative to the substrate support, wherein adjusting the position of the showerhead includes adjusting the showerhead to a tilted position based on data indicating a correlation between the position of the showerhead and azimuthal etching non-uniformities associated with etching the substrate, wherein the data indicates sensitivities of the azimuthal etching non-uniformities to respective positions of a plurality of different tilted positions of the showerhead and includes respective standard deviations of etch amounts across a surface of the substrate for each of the plurality of different tilted positions; and
   with the showerhead in the tilted position as adjusted based on the data, performing a trim step to etch the plurality of mandrels,
   wherein adjusting the position of the showerhead includes adjusting the position of the showerhead to a tilted position having a smallest standard deviation from among the respective standard deviations of the etch amounts across the surface of the substrate for each of the plurality of different tilted positions as indicated by the data.

2. The method of claim 1, further comprising collecting the data and storing the data in memory.

3. The method of claim 2, wherein collecting the data includes adjusting the showerhead to the plurality of different tilted positions, performing a plurality of trim steps when the showerhead is in the plurality of different tilted positions, and determining azimuthal etching non-uniformities associated with performing the plurality of trim steps in each of the plurality of different tilted positions.

4. The method of claim 1, further comprising, subsequent to performing the trim step, depositing a spacer layer on the mandrels.

5. The method of claim 1, wherein the trim step is performed in a self-aligned double patterning process.

6. The method of claim 1, further comprising determining the tilted position of the showerhead based on the data and providing information indicating the tilted position.

7. The method of claim 6, further comprising providing the information to a user interface.

8. The method of claim 6, further comprising controlling an actuator to adjust the position of the showerhead to the tilted position based on the information.

* * * * *